United States Patent
Shen et al.

(10) Patent No.: US 8,021,970 B2
(45) Date of Patent: Sep. 20, 2011

(54) METHOD OF ANNEALING A DIELECTRIC LAYER

(75) Inventors: Jinmiao J. Shen, Austin, TX (US);
Cheong M. Hong, Austin, TX (US);
Sung-Taeg Kang, Austin, TX (US);
Marc A Rossow, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/408,444

(22) Filed: Mar. 20, 2009

(65) Prior Publication Data

US 2010/0240206 A1    Sep. 23, 2010

(51) Int. Cl.
*H01L 21/4763* (2006.01)

(52) U.S. Cl. ........ 438/591; 438/257; 438/592; 438/259; 438/255; 257/316; 257/315; 257/E29.001; 257/E21.159; 977/774

(58) Field of Classification Search .......... 438/591, 438/257, 197, 211, 263, 255, 259, 592; 257/77, 257/100, 410, 324, 315, 316, E29.001, E21.159; 977/774
See application file for complete search history.

(56) References Cited

U.S. PATENT DOCUMENTS

| | | | |
|---|---|---|---|
| 6,297,095 B1* | 10/2001 | Muralidhar et al. | 438/257 |
| 7,361,567 B2 | 4/2008 | Rao et al. | |
| 2003/0057432 A1* | 3/2003 | Gardner et al. | 257/100 |
| 2004/0241948 A1* | 12/2004 | Nieh et al. | 438/287 |
| 2007/0202645 A1 | 8/2007 | Luo et al. | |
| 2009/0273013 A1* | 11/2009 | Winstead et al. | 257/315 |

OTHER PUBLICATIONS

U.S. Appl. No. 11/364,128, filed Feb. 28, 2006.
U.S. Appl. No. 11/846,633, filed Aug. 29, 2007.

* cited by examiner

*Primary Examiner* — Matthew Smith
*Assistant Examiner* — Wilner Jean Baptiste
(74) *Attorney, Agent, or Firm* — Kim-Marie Vo; Joanna G. Chiu

(57) ABSTRACT

A method includes forming a first dielectric layer over a substrate; forming nanoclusters over the first dielectric layer; forming a second dielectric layer over the nanoclusters; annealing the second dielectric layer using nitrous oxide; and after the annealing the second dielectric layer, forming a gate electrode over the second dielectric layer.

18 Claims, 2 Drawing Sheets

METHOD OF ANNEALING A DIELECTRIC LAYER

BACKGROUND

1. Field

This disclosure relates generally to annealing a dielectric layer, and more specifically, to annealing a dielectric layer that can be used in a non-volatile memory device.

2. Related Art

Non-volatile memory (NVM) devices are advantageous because they retain charge when no power is applied. Typical NVM devices include a floating gate memory. However, nanocrystal or nanocluster memories have been found to be advantageous over floating gate memories because the nanocrystal memory has less charge leakage, which is created from gate dielectric defects. During hot carrier injection of electrons into the nanocrystals, some electrons may become trapped in the control oxide, which undesirably increases threshold voltage. Because it is not possible to erase the charge trapped in the control oxide, the electrons accumulate during operation and the threshold voltage continues to increase further. In addition, the charge in the control oxide can decrease reliability due to internal electric fields working concomitantly with an external bias. For example, electrons trapped in the control oxide can degrade data retention of nanocrystals programmed with electrons by accelerating tunneling loss through the portion of the dielectric under the nanocrystals. Thus, there is a desire for nanocrystal memories that do not have the problems discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have found that performing a nitrous oxide anneal after forming the control oxide decrease trap-ups and improves data retention. The inventors have determined that decreasing nitrogen concentration in the control oxide improves electrical performance. However, nitrous oxide, which has more nitrogen than some other precursors, such as nitric oxide (NO) surprisingly has improved electrical performance.

Figure 1:
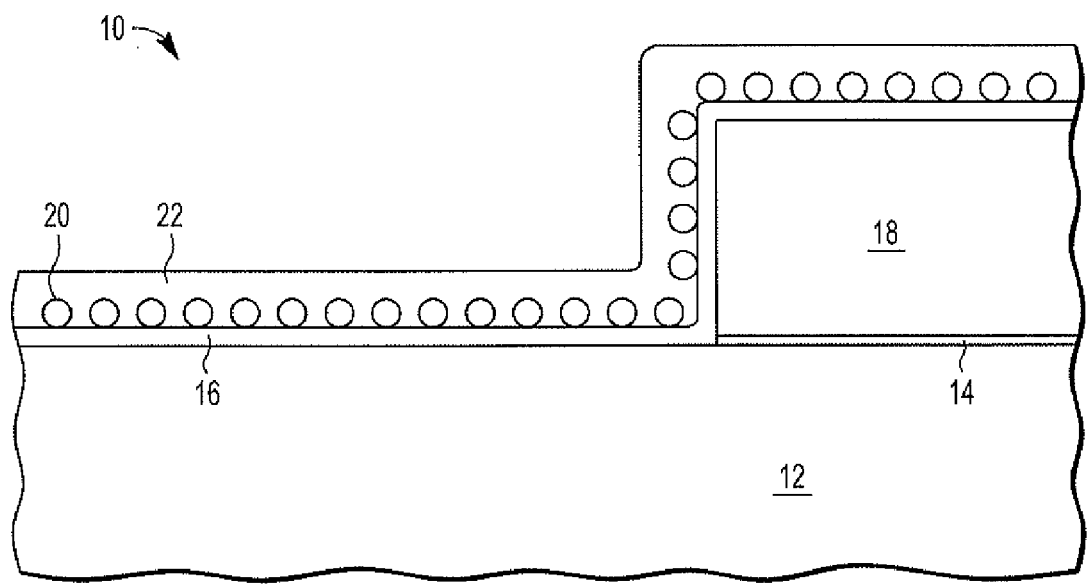
FIG. 1 illustrates a cross-section of a semiconductor device, such as a non-volatile memory device, after forming a dielectric layer in accordance with an embodiment of the present invention.

FIG. 1 illustrates a cross-section of a semiconductor device 10, such as a thin film storage non-volatile memory (TFS NVM) device in accordance with an embodiment of the present invention. More specifically, in the embodiment illustrated, the TFS NVM device is a split gate device. The semiconductor device 10 includes a semiconductor substrate 12, a first dielectric layer, which in the embodiment illustrated is a select oxide 14, a second dielectric layer 16, which in the embodiment illustrated is a buried oxide layer (BOX), nanoclusters 20, and a third dielectric layer 22, which may be high temperature oxide formed by a high temperature oxide process known to one skilled in the art.

The semiconductor substrate 12 can be any semiconductor material or combinations of materials, such as gallium arsenide, silicon germanium, silicon-on-insulator (SOI), silicon, monocrystalline silicon, the like, and combinations of the above. The first dielectric layer 14 can be any suitable dielectric material, such as thermally grown silicon dioxide. In one embodiment, the first dielectric layer 14 is approximately 3 nanometers thick and is formed over the semiconductor substrate 12. After forming the first dielectric layer 14, a select gate 18 (or select gate electrode) is formed over a portion of the first dielectric layer 14. In one embodiment, the select gate 18 is polysilicon that is deposited and patterned to form the select gate 18.

In one embodiment, the second dielectric layer 16 is formed by thermally oxidizing the first dielectric layer 14 to form a thicker layer of silicon dioxide. In one embodiment, the second dielectric layer (which includes the first dielectric layer 14 and the amount that it is increased) is approximately 5 nm thick. After forming the second dielectric layer 16, nanoclusters 20, which may be also referred to as nanocrystals, are formed. In one embodiment the nanoclusters 20 are made of silicon and have a density of between 5E11 to 1.2E12 centimeters squared. Due to processing variations, each nanocluster 20 may vary is size, such as a between approximately 3 to approximately 10 nanometers. The nanoclusters 20 may be formed by chemical deposition or other suitable processes. For example, the nanoclusters 20 may be formed by recrystallization of a thin amorphous layer of silicon and the deposition of a thin amorphous layer of silicon and the deposition of prefabricated nanoclusters.

After forming the nanoclusters 20, a third dielectric layer 22 is formed over the nanoclusters 20. The third dielectric layer 22, which may be a control oxide, may be formed using chemical vapor deposition or plasma-enhanced chemical vapor deposition. The second dielectric layer 16, the nanoclusters 20, and the third dielectric layer 22 (the stack) are formed on all exposed structures and hence this stack is formed over the exposed portion of the first dielectric layer 14, the sidewall of the select gate 18 and the top of the select gate 18.

In one embodiment, the third dielectric layer 22 is formed using a silicon-containing gas, such as silane, as a precursor at a temperature in a range of approximately 600 to approximately 1000 degrees Celsius. In one embodiment, the third dielectric layer 22 is silicon dioxide. After the third dielectric layer 22 is formed structural defects, such as bond defects are present. For example, silicon dangling bonds and weak silicon to hydrogen bonds, which cause undesirable charge traps, may be present. If silane is used as the precursor to form the control oxide 16, because silane dissociates during the deposition process, weak silicon to hydrogen bonds are formed in the third dielectric layer 22. In addition, other types of bond defects, such as weak silicon to silicon bonds, strained silicon oxygen bonds and silicon to OH bonds may be present.

To reduce the bond defects, an anneal 24 is performed after forming the third dielectric layer 22. The anneal 24 includes a nitrous oxide (N2O) environment. In one embodiment, pure nitrous oxide is used meaning that there is no carrier gas flown at the same time as the nitrous oxide. In another embodiment, a carrier gas, such as N2 or Ar, is used in addition to the nitrous oxide. In one embodiment, the anneal is performed at a temperature between approximately 700 to approximately 1200 degrees Celsius. In another embodiment, the anneal is performed at a temperature between approximately 850 to approximately 1050 degrees Celsius. In one embodiment, the anneal is performed for approximately 15 to approximately 1.5 minutes. In another embodiment, the anneal is performed for approximately 45 seconds to approximately 1 minute. After the anneal, as will be explained in more detail below, the inventors believe that the bond defects are minimized, resulting in improved reliability and performance.

After forming the anneal, a control gate 26 (or control gate electrode) is formed over the control oxide 22 and laterally adjacent the select gate 24. In one embodiment, the control gate 26 is polysilicon that is formed and patterned. The portions of the stack, which includes the second dielectric layer 16, the nanoclusters 20, and the third dielectric layer 22, that are adjacent the control gate 26 and over the select gate 18 or adjacent the control gate 26 and at the corner of the select gate 18 are removed during a suitable process, such as a wet etch or plasma etch.

Figure 2:
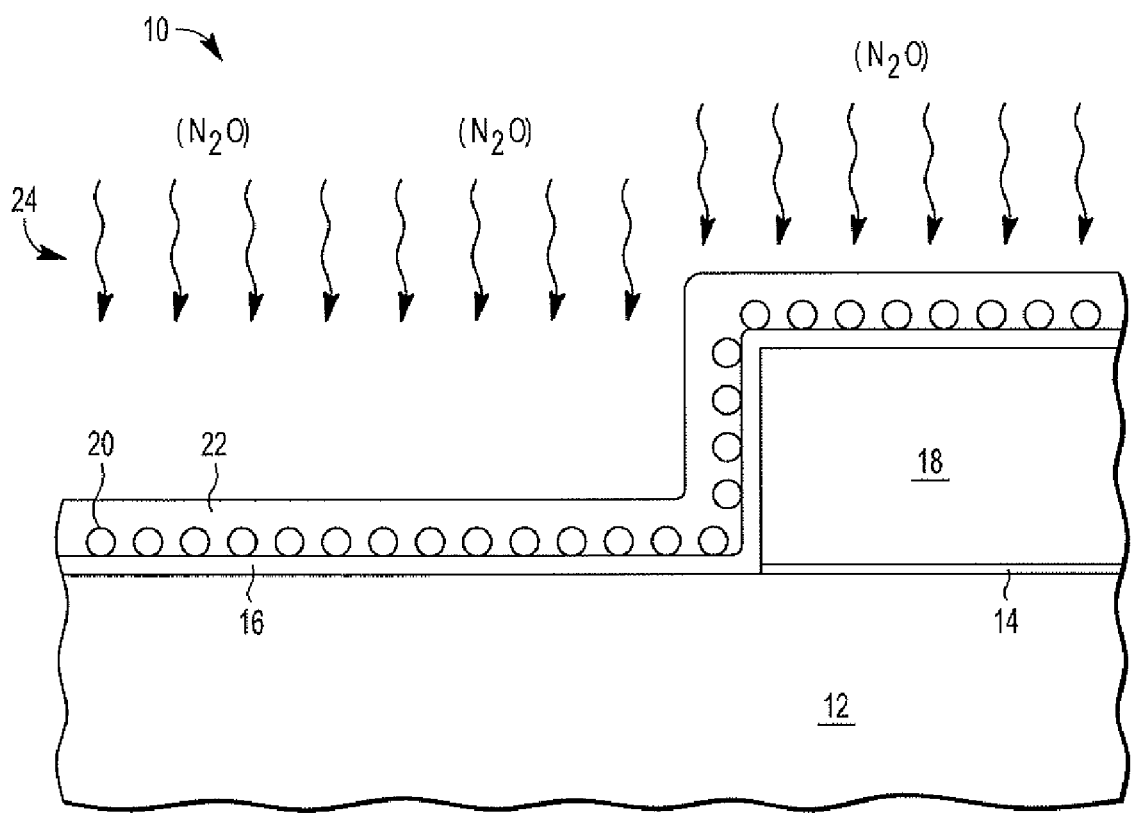
FIG. 2 illustrates the semiconductor device of FIG. 1 after annealing the dielectric layer in accordance with an embodiment of the present invention.
Figure 3:
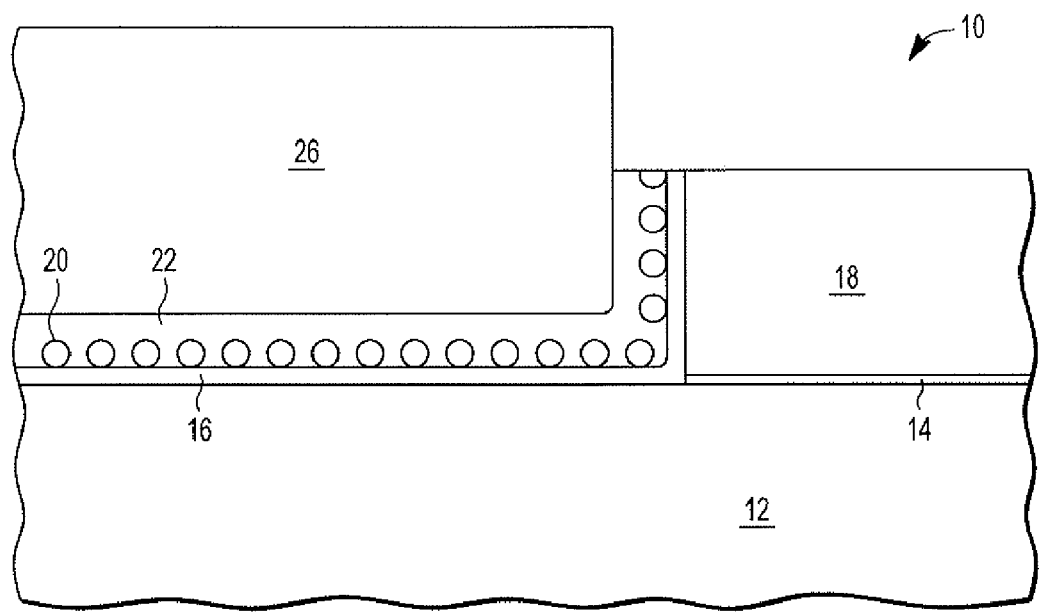
FIG. 3 illustrates the semiconductor device of FIG. 2 after forming a control gate in accordance with an embodiment of the present invention.
Figure 4:
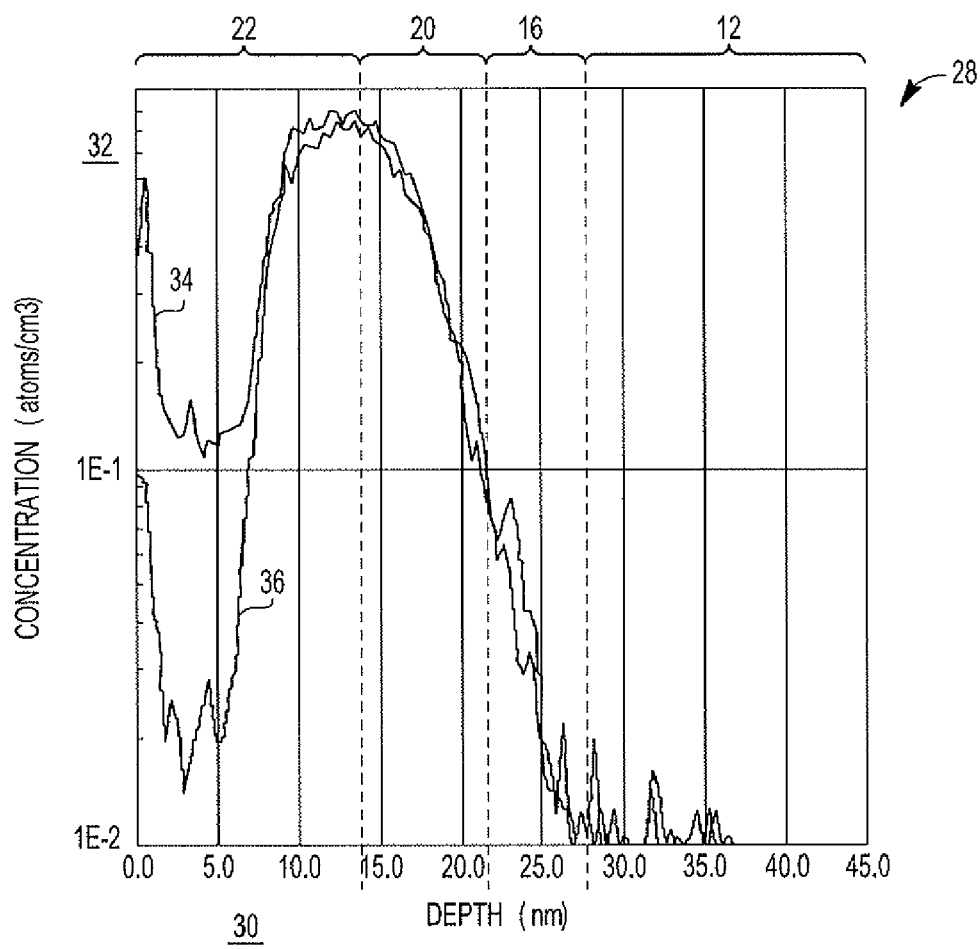
FIG. 4 illustrates experimental data showing the nitrogen concentration in various layers of the semiconductor device of FIG. 2 after performing two different types of anneals.

FIG. 4 illustrates sample experimental data 28 resulting from a SIMS analysis of dielectric layers annealed in nitrogen (N2) versus nitrous oxide (N2O). The x-axis 30 shows the depth into the semiconductor device 10 of FIG. 2. The first approximately 14 nanometers are the control oxide 22, the next approximately 7 nanometers are the nanoclusters 20, the next approximately 6 nanometers are the second dielectric layer 16, and the rest is the substrate 12. In this experiment, the control oxide 22 is silicon dioxide formed using silane, the nanoclusters 20 are silicon, the second dielectric layer 16 is thermally grown silicon dioxide and the substrate is silicon. The y-axis 32 shows the concentration of nitrogen atoms per centimeter cubed. Curve 34 is the nitrogen curve meaning it is the nitrogen profile of the semiconductor device 10 of FIG. 2 after performing a nitrogen anneal as opposed to a nitrous oxide anneal as shown in FIG. 2. Curve 36 is the nitrous oxide curve meaning it is the nitrogen profile of the semiconductor device 10 of FIG. 2 after the nitrous oxide anneal 24. As illustrated the nitrogen profile in the control oxide 22 is decreased when using nitrous oxide versus nitrogen as the annealing gas in the anneal 24. The inventors have determined that the decrease in nitrogen for unknown reasons improves data retention and decreases trap-up. Through similar experiments, the inventors have also found that it is desirable to reduce hydrogen to improve electrical properties and reliability. Hence, nitrous oxide is more desirable than a nitrogen anneal or an ammonia anneal.

Because the inventors have determined from their experimental SIMS data that decrease nitrogen concentration is desired to improve data retention and trap-up, it is surprising that the inventors found that based on their electrical data that a nitrous oxide anneal (N2O), which has more nitrogen than nitric oxide (NO), improves data retention and trap-up better than a nitric oxide (NO) anneal. The NO anneal breaks up in to nitrogen and oxygen radicals. The nitrous oxide can break up in nitrogen and oxygen radicals or a combination of radicals with nitric oxide. Hence, nitrous oxide is desirable over NO anneal.

By now it should be appreciated that there has been provided a method for forming a semiconductor device, such as a nonvolatile memory device, that has improved performance. Data retention is improved and trap-ups are decreased by anneal the third dielectric layer 22 in a nitrous oxide. The anneal improves the bonds in the dielectric layer.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method comprising:
    forming a first dielectric layer over a substrate;
    forming nanoclusters over the first dielectric layer;
    forming a second dielectric layer over the nanoclusters;
    annealing the second dielectric layer using nitrous oxide;
    after the annealing the second dielectric layer, forming a gate electrode over the second dielectric layer; and
    forming a select gate electrode over the substrate and laterally adjacent the gate electrode, wherein a portion of the first dielectric layer, a portion of the nanoclusters, and a portion of the second dielectric layer are between the gate electrode and the select gate electrode.

2. The method of claim 1, wherein the annealing the second dielectric layer comprises:
    annealing the second dielectric layer using nitrous oxide at a temperature in a range of approximately 700 degrees Celsius to approximately 1200 degrees Celsius.

3. The method of claim 1, wherein the annealing the second dielectric layer comprises:
    annealing the second dielectric layer using nitrous oxide at a temperature in a range of approximately 850 degrees Celsius to approximately 1050 degrees Celsius.

4. The method of claim 1, wherein the annealing the second dielectric layer comprises:
    annealing the second dielectric layer using nitrous oxide for a duration in a range of approximately 15 second to approximately 90 seconds.

5. The method of claim 1, wherein the annealing the second dielectric layer comprises:
    annealing the second dielectric layer using nitrous oxide for a duration in a range of approximately 45 second to approximately 60 seconds.

6. The method of claim 1, wherein the annealing the second dielectric layer comprises:
   annealing the second dielectric layer using pure nitrous oxide.

7. The method of claim 1, wherein the annealing the second dielectric layer comprises:
   annealing the second dielectric layer using nitrous oxide in a nitrogen-containing carrier gas.

8. The method of claim 1, wherein the annealing the second dielectric layer comprises:
   annealing the second dielectric layer using nitrous oxide in an argon-containing carrier gas.

9. The method of claim 1, wherein forming the second dielectric layer comprises:
   forming an oxide layer using a silicon-containing gas.

10. The method of claim 9, wherein the forming the oxide layer using the silicon-containing comprises:
    forming a high temperature oxide layer using a silicon-containing gas.

11. A method comprising:
    growing a first dielectric layer over a substrate;
    chemical vapor depositing nanoclusters over the first dielectric layer;
    forming a second dielectric layer over the nanoclusters using a silicon-containing gas;
    annealing the second dielectric layer using nitrous oxide;
    after the annealing the second dielectric layer, forming a gate electrode over the second dielectric layer; and
    annealing the second dielectric layer using nitrous oxide for a duration in a range of approximately 45 second to approximately 60 seconds.

12. The method of claim 11, wherein the annealing the second dielectric layer comprises:
    annealing the second dielectric layer using nitrous oxide at a temperature in a range of approximately 850 degrees Celsius to approximately 1050 degrees Celsius.

13. The method of claim 11, wherein the annealing the second dielectric layer comprises:
    annealing the second dielectric layer using pure nitrous oxide.

14. The method of claim 11, wherein the annealing the second dielectric layer comprises:
    annealing the second dielectric layer using nitrous oxide in a nitrogen-containing carrier gas.

15. The method of claim 11, wherein the annealing the second dielectric layer comprises:
    annealing the second dielectric layer using nitrous oxide in an argon-containing carrier gas.

16. The method of claim 11, wherein the forming the second dielectric layer comprises:
    forming a high temperature oxide layer using the silicon-containing gas.

17. A method comprising:
    forming a select gate electrode over a substrate;
    forming a first dielectric layer over the substrate, adjacent a sidewall of the select gate, and over the select gate;
    forming nanoclusters over the first dielectric layer;
    forming a second dielectric layer over the nanoclusters;
    annealing the second dielectric layer using nitrous oxide; and
    after the annealing the second dielectric layer, forming a control gate electrode over the second dielectric layer, wherein the control gate electrode is laterally adjacent the select gate electrode, and wherein a portion of the first dielectric layer, a portion of the nanoclusters, and a portion of the second dielectric layer are between the control gate electrode and the select gate electrode.

18. The method of claim 17, wherein the annealing the second dielectric layer comprises:
    annealing the second dielectric layer using pure nitrous oxide, using nitrous oxide in a nitrogen-containing carrier gas, or using nitrous oxide in an argon-containing carrier gas.

* * * * *